US 8,050,043 B2

(12) United States Patent
Choi et al.

(10) Patent No.: US 8,050,043 B2
(45) Date of Patent: Nov. 1, 2011

(54) PRINTED CIRCUIT BOARD FACILITATING EXPANSION OF NUMBER OF MEMORY MODULES AND MEMORY SYSTEM INCLUDING THE SAME

(75) Inventors: Hyun-Jin Choi, Gyeonggi-do (KR); Young-Chan Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1085 days.

(21) Appl. No.: 11/560,763

(22) Filed: Nov. 16, 2006

(65) Prior Publication Data

US 2007/0134968 A1 Jun. 14, 2007

(30) Foreign Application Priority Data

Nov. 18, 2005 (KR) .................. 10-2005-0110506

(51) Int. Cl.
*H05K 7/00* (2006.01)
(52) U.S. Cl. .................................... 361/760; 439/61
(58) Field of Classification Search ............ 361/760, 361/761; 439/61
See application file for complete search history.

(56) References Cited

U.S. PATENT DOCUMENTS

| 6,137,164 A * | 10/2000 | Yew et al. | 257/686 |
| 6,577,004 B1 * | 6/2003 | Rumsey et al. | 257/738 |
| 6,617,671 B1 * | 9/2003 | Akram | 257/668 |
| 2004/0019758 A1 * | 1/2004 | Shibata et al. | 711/170 |
| 2004/0186956 A1 | 9/2004 | Perego et al. | |

FOREIGN PATENT DOCUMENTS

| JP | 2002-26228 | 1/2002 |
| JP | 2004-118915 | 4/2004 |
| KR | 2004-0012523 | 2/2004 |

OTHER PUBLICATIONS

English language abstract for Korean Publication No. 2004-0012523.
English language abstract for Japanese Publication No. 2002-26228.
English language abstract for Japanese Publication No. 2004-118915.

* cited by examiner

*Primary Examiner* — Nabil El Hady
*Assistant Examiner* — Abiy Getachew
(74) *Attorney, Agent, or Firm* — Volentine & Whitt, PLLC

(57) ABSTRACT

Disclosed herein is a printed circuit board facilitating expansion of number of memory modules and memory system including the same. The printed circuit board of the present invention includes a plurality of slots and a plurality of controller terminals. Each of slots disposed in locations ranging from a $2^{n-1}+1$th location to a $2^n$th location with respect to the controller terminals includes $2^{k-n}$ module terminals connected to the module terminals of slots ranging from the slot disposed in the first location to a slot disposed in a $2^{n-1}$th location; wherein, in the printed circuit board and memory system including the printed circuit board according to the present invention, dummy modules are not required to expand the number of memory modules. Further, according to the printed circuit board of the present invention, the expansion of the number of memory modules is facilitated.

4 Claims, 8 Drawing Sheets

PRINTED CIRCUIT BOARD FACILITATING EXPANSION OF NUMBER OF MEMORY MODULES AND MEMORY SYSTEM INCLUDING THE SAME

CROSS-REFERENCE TO RELATED APPLICATIONS

This U.S. non-provisional patent application claims priority under 35 U.S.C. §119 of Korean Patent Application No. 10-2005-110506, filed on Nov. 18, 2005, the entire contents of which are hereby incorporated by reference.

BACKGROUND OF THE INVENTION

1. Field of the Invention

The present invention relates, in general, to printed circuit boards and, more particularly, to a printed circuit board, which has a wiring structure enabling the number of memory modules mounted on the printed circuit board to be easily expanded.

2. Description of the Related Art

Generally, a memory device is used to temporarily or permanently store data or instructions used in computer systems, such as a personal computer (PC), a workstation or a server. Dynamic Random Access Memory (DRAM), Static RAM (SRAM), Rambus DRAM, and Extreme Date Rate (XDR) DRAM can be referred as a representative memory device. Such a memory device is actually applied to a computer system in the form of a module (hereinafter, referred to as a 'memory module'). That is, a memory module, in which a plurality of memory devices is mounted, is connected to and is installed in a panel (for example, a motherboard provided in a PC), with the memory module being inserted into a slot on a Printed Circuit Board (PCB).

Meanwhile, a processor (typical chipset) and a memory module are connected to each other through various wiring schemes. In this case, wiring is implemented in a point-to-point manner. In point-to-point wiring, data or a signal generated by the processor is actually effectively provided only to a single memory device mounted in the memory module.

FIG. 1 is a diagram of a memory system including a conventional PCB 100, which shows the structure existing before memory modules are inserted into slots. The PCB 100 of FIG. 1 includes two slots 110 and 120, into which memory modules, each having a plurality of memory devices mounted therein, can be inserted. In FIG. 1, wires 131 to 133 transmit data. Further, the controller terminals 141 of the wires 131 and 132 are connected to a processor 1 and are capable of transmitting or receiving data to or from the processor 1. The module terminals 142 and 143 of the wires 131 and 133 are electrically connected to a memory module inserted into the first slot 110, and are capable of transmitting or receiving data to or from the memory module. Further, the module terminals 144 and 145 of the wires 132 and 133 are electrically connected to a memory module inserted into the second slot 120 and are capable of transmitting or receiving data to from the memory module. In FIG. 1, wires 134 and 135 transmit instruction signals. The instruction signals received by the connection terminals 146 of the processor 1 are provided to the connection terminals 147 and 148 of the slots 110 and 120 through the wires 134 and 135, respectively. Further, the driving of memory devices mounted in the memory modules is controlled by the provided instruction signals.

However, in the conventional PCB 100, individual wires 133 are not connected to the controller terminals, which can be directly connected to the processor 1. In the conventional PCB 100, when a memory module is inserted only into the first slot 110, the module terminals 143 of the first slot 110 are not electrically connected to the processor 1.

Therefore, in the conventional PCB 100, as shown in FIG. 2, when only a single memory module is actually used to store valid data, the insertion of a dummy module 170 into the second slot 120 is required. Through the connecting wires 171 of the dummy module 170, the module terminals 144 of wires 132 are electrically connected to the module terminals 145 of wires 133. Furthermore, the memory devices 161 of a memory module 160 inserted into the first slot 110 can transmit or receive data through DQ pads 161$b$ connected to module terminals 143.

Meanwhile, in order to expand the number of memory modules, two memory modules 160 and 180 are inserted into first and second slots 110 and 120, respectively, as shown in FIG. 3. In this case, data is not input/output through DQ pads 161$b$ and 181$b$ connected to the module terminals 143 and 145 of the wires 133.

However, in the conventional PCB 100, only a maximum of two memory modules can be mounted. Therefore, the conventional PCB 100 is problematic in that it is difficult to expand the number of memory modules.

SUMMARY OF THE INVENTION

Accordingly, the present invention has been made keeping in mind the above problems occurring in the prior art, and an object of the present invention is to provide a Printed Circuit Board (PCB), which does not require the use of a dummy module, and a memory system including the PCB.

Another object of the present invention is to provide a PCB, which enables the expansion of the number of memory modules to be facilitated, and a memory system using the PCB.

In accordance with one aspect of the present invention to accomplish the above objects, there is provided a printed circuit board. The printed circuit board of the present invention comprises a plurality of slots sequentially formed on a predetermined location on the printed circuit board, and connected to controller terminals through a plurality of wires, each slot being constructed so that a memory module in which at least one memory device capable of receiving $2^k$ pieces of data in parallel can be mounted can be inserted into the slot; and the controller terminals for transmitting or receiving data to or from a processor in parallel, the controller terminals being constructed so that $2^k$ controller terminals are arranged for a single memory device mounted in the memory module. And, a slot disposed in a first location with respect to the controller terminals has $2^k$ module terminals, which are connected to the controller terminals in a point-to-point manner and are sequentially arranged. Each of slots disposed in locations ranging from a $(2^{n-1}+1)$th location (where n is a natural number equal to or less than k) to a $2^n$th location with respect to the controller terminals is connected in a point-to-point manner to module terminals of a corresponding one of slots ranging from the slot disposed in the first location to a slot disposed in a $2^{n-1}$th location in a point-to-point manner, and each of the slots includes $2^{k-n}$ module terminals, wherein the $2^{k-n}$ module terminals are sequentially arranged. And, each of the module terminals can provide data to a single memory device mounted in a memory module connected to whereto.

In accordance with another aspect of the present invention to accomplish the above objects, there is provided a memory system. The memory system of the present invention comprises a processor for generating an instruction signal and data; a printed circuit board including $2^k$ controller terminals (where k is a natural number), capable of transmitting or receiving data in parallel to or from the processor and capable of transmitting or receiving data to or from a single memory device, and a plurality of sequentially formed slots; and a plurality of memory modules inserted into the plurality of slots, each memory module having at least one memory device. And, a slot disposed in a first location with respect to the controller terminals has $2^k$ module terminals, which are connected to the controller terminals in a point-to-point manner and are sequentially arranged. Each of slots disposed in locations ranging from a $(2^{n-1}+1)$th location (where n is a natural number equal to or less than k) to a $2^n$th location with respect to the controller terminals is connected in a point-to-point manner to module terminals of a corresponding one of slots ranging from the slot disposed in the first location to a slot disposed in a $2^{n-1}$th location in a point-to-point manner, and each of the slots includes $2^{k-n}$ module terminals, wherein the $2^{k-n}$ module terminals are sequentially arranged. And, each of the module terminals can provide data to a single memory device mounted in a memory module connected to whereto.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
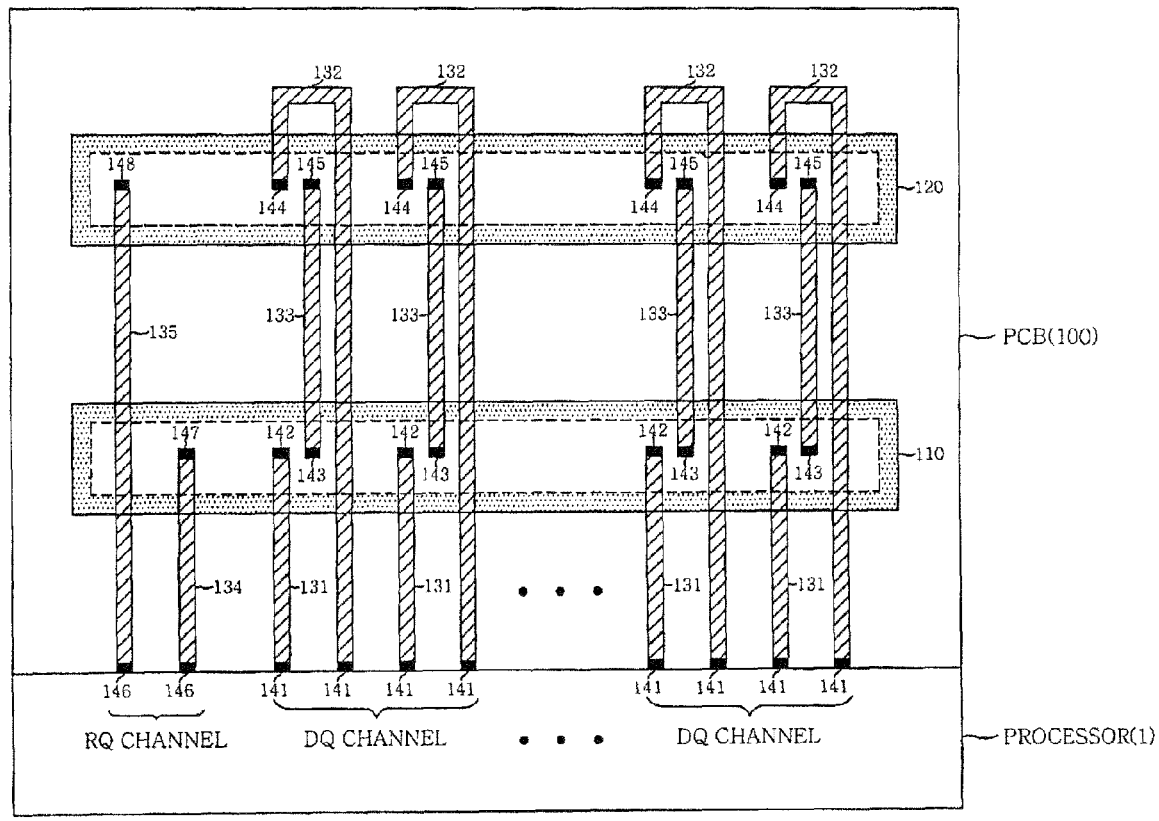
FIG. 1 is a diagram of a memory system including a conventional PCB, which shows the structure existing before memory modules are inserted into slots.
Figure 2:
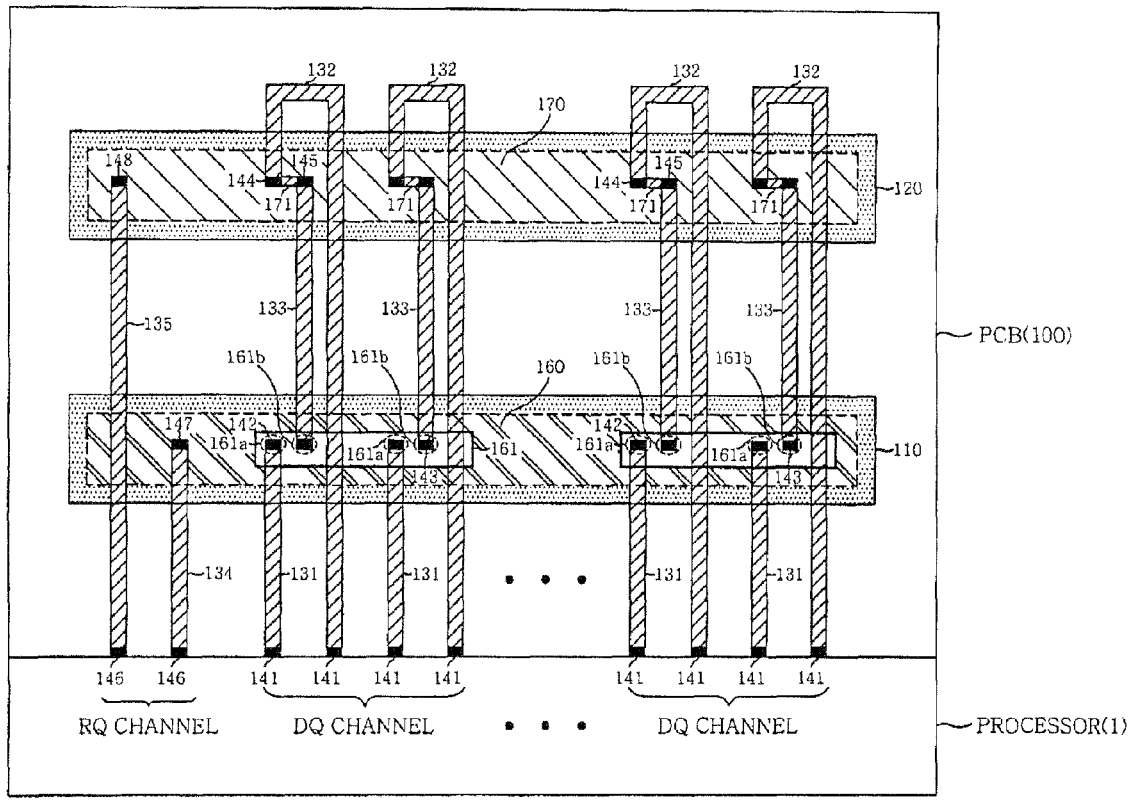
FIG. 2 is a diagram showing the case where the number of memory modules actually used in the PCB of FIG. 1 is one.
Figure 3:
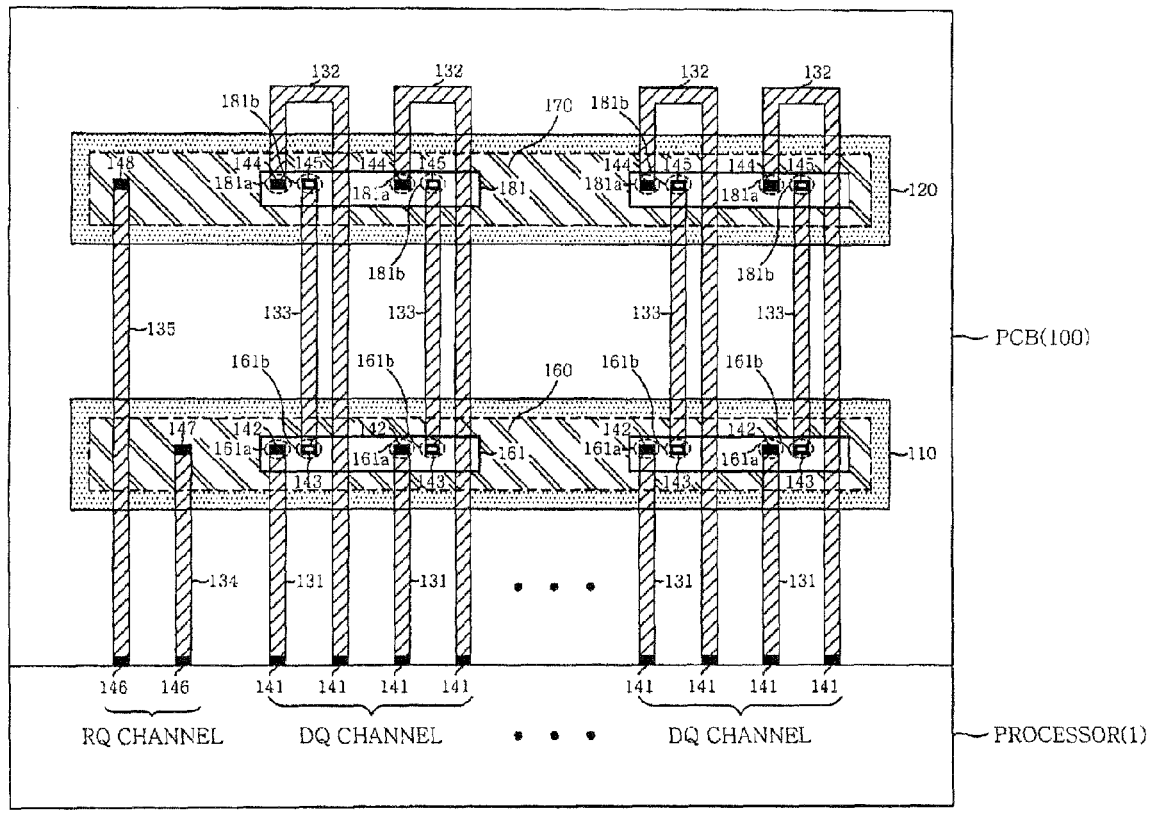
FIG. 3 is a diagram showing the case where the number of memory modules actually used in the PCB of FIG. 1 is expanded to two.

Reference now should be made to the drawings, in which the same reference numerals are used throughout the different drawings to designate the same or similar components. In the following description, various specific details, such as detailed processing flows, are described in order to provide a complete understanding of the present invention. Detailed descriptions may be omitted if it is determined that the detailed descriptions of related well-known functions and construction may make the gist of the present invention unclear.

In the drawings attached to the present specification, a limited number of memory slots are shown. However, this is only for convenience of understanding of the present invention, and is not intended to limit the present invention.

Hereinafter, the present invention is described in detail by describing preferred embodiments of the present invention with reference to the attached drawings.

Figure 4:
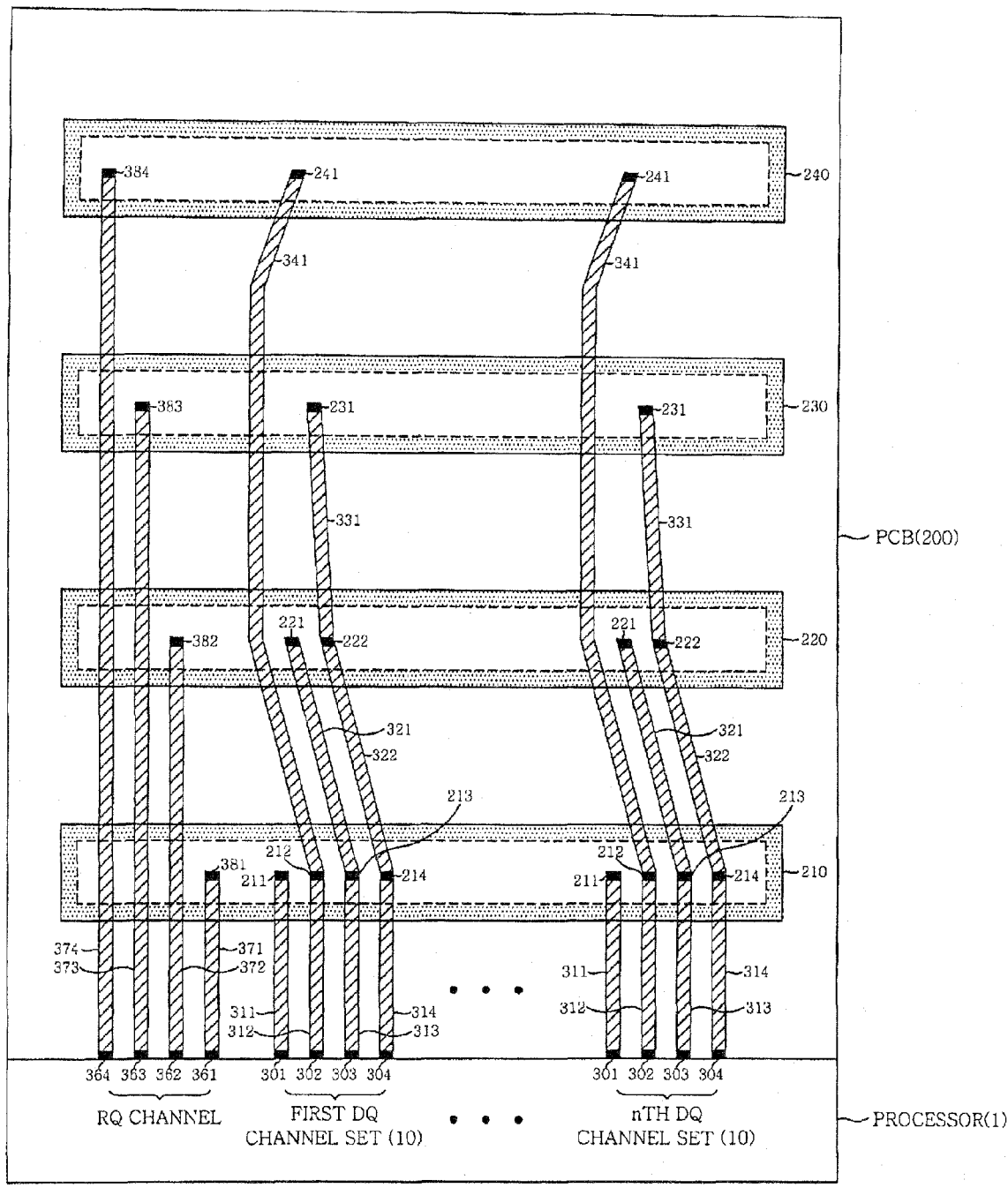
FIG. 4 is a diagram showing a PCB and a memory system including the PCB according to an embodiment of the present invention.

FIG. 4 is a diagram showing a PCB 200 and a memory system including the PCB 200 according to an embodiment of the present invention. The memory system of the present invention includes the PCB 200 and a processor 1.

In the PCB 200 of FIG. 4, $2^k$ slots 210, 220, 230 and 240 are provided. Further, $2^k$ (where k is a natural number) controller terminals 301 to 304 are provided to correspond to each of the DQ channel sets 10 of the processor 1. In the embodiment of FIG. 4, k is 2. That is, the number of controller terminals corresponding to each DQ channel set 10 is 4, and the number of slots is also 4.

In FIG. 4, the controller terminals 301 to 304 corresponding to each DQ channel set 10 can transmit or receive data in parallel to or from the processor 1 to correspond to a single memory device among memory devices mounted in each of the memory modules inserted into the slots 210, 220, 230 and 240.

For reference, in the processor 1 shown in FIG. 4, i DQ channel sets are implemented. Therefore, in each of the memory modules inserted into the slots 210, 220, 230 and 240, a minimum of one to a maximum of i memory devices, which can be effectively driven, can be mounted. In this case, each memory device may have four DQ pads capable of effectively transmitting or receiving data.

In the slot 210 disposed in a first location with respect to the controller terminals 301 to 304, four module terminals 211 to 214 are arranged for a single DQ channel set 10. Further, the module terminals 211 to 214 are electrically connected to the controller terminals 301 to 304 through wires 311 to 314, respectively, in a point-to-point manner.

That is, the first module terminal 211 of the first slot 210, disposed leftmost, is electrically connected to the first controller terminal 301, also disposed leftmost. Further, the second to fourth module terminals 212 to 214 of the first slot 210, disposed second to fourth from the left, are connected to the second to fourth controller terminals 302 to 304 also disposed second to fourth from the left.

Meanwhile, the slots disposed in locations ranging from a $(2^{n-1}+1)$th location (where n is a natural number equal to or less than k) to a $2^n$th location with respect to the controller terminals 301 to 304 correspond to slots ranging from the slot 210 disposed in the first location to a slot disposed in a $2^{n-1}$th location in a one-to-one manner. Further, each of the slots disposed in locations ranging from a $(2^{n-1}+1)$th location (where n is a natural number equal to or less than k) to a $2^n$th location with respect to the controller terminals 301 to 304 has $2^{k-n}$ module terminals. The $2^{k-n}$ module terminals are connected to the module terminals of a corresponding slot in a point-to-point manner and are sequentially arranged.

Preferably, the module terminals of each of the slots disposed in locations ranging from the $(2^{n-1}+1)$th location to the $2^n$th location are electrically connected to the $(2^{k-n}+1)$th to $2^{k-n+1}$th module terminals of a corresponding slot.

Preferably, wires, which are required for connecting the module terminals of respective slots to each other, are not intersected.

Next, with reference to FIG. 4, a preferred embodiment is described. For example, the case where n=1 is considered. In this case, a slot disposed in locations ranging from a $(2^{n-1}+1)$th location to a 2nth location with respect to the controller terminals 301 to 304 is the slot 220 disposed in the second location with respect to the controller terminals 301 to 304.

In the slot 220 disposed in the second location with respect to the controller terminals 301 to 304, two module terminals 221 and 222 are arranged for a single DQ channel set. Further, the module terminals 221 and 222 are electrically connected to the third and fourth module terminals 213 and 214 of the first slot 210 through the wires 321 and 322, respectively, in a point-to-point manner.

That is, the first module terminal 221 of the second slot 220, disposed leftmost, is electrically connected to the third module terminal 213 of the first slot 210. Further, the second module terminal 222 of the second slot 220, disposed second from the left, is connected to the fourth module terminal 214 of the first slot 210.

Next, the case where n=2 is considered. In this case, the slots disposed in locations ranging from a $(2^{n-1}+1)$th location to a $2^n$th location with respect to the controller terminals 301 to 304 are the slots 230 and 240 disposed in the third and fourth locations with respect to the controller terminals 301 to 304.

With respect to a single DQ channel set, the module terminals 231 and 241 are respectively arranged in the slots 230 and 240 disposed in third and fourth locations with respect to the controller terminals 301 to 304. Further, the module terminals 231 and 241 are electrically connected to the second module terminals 222 and 212 of the second slot 220 and the first slot 210 through the wires 331 and 341, respectively, in a point-to-point manner.

In FIG. 4, wires 371 to 374 transmit instruction signals. The instruction signals received through the connecting terminals 361 to 364 of the processor 1 are provided to the connecting terminals 381 to 384 of the slots 210 to 240 through the wires 371 to 374, respectively. Further, the driving of the memory devices mounted in the memory modules is controlled in response to the provided instruction signals.

Figure 5:
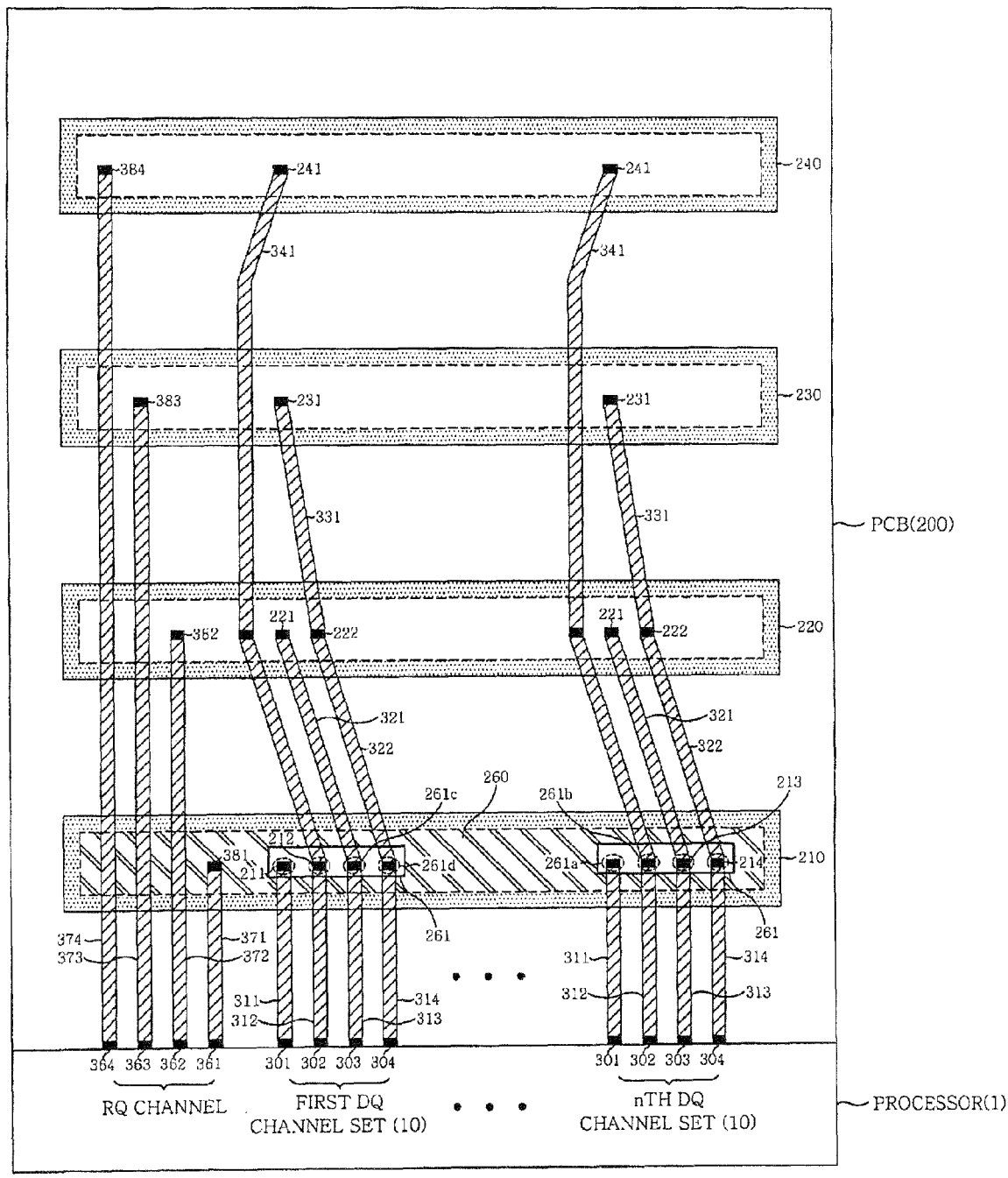
FIG. 5 is a diagram showing the case where a memory module is inserted only into the first slot in the PCB of FIG. 4.

FIG. 5 is a diagram showing the case where a memory module 260 is inserted only into the first slot 210 in the PCB of FIG. 4. As shown in FIG. 5, even if dummy modules are not inserted into the remaining slots 220, 230 and 240, data can be transmitted to respective module terminals 211 to 214 of the first slot 210. In this case, in a memory device 261 mounted in the memory module 260, data can be effectively input or output through DQ pads 261a to 261d connected to the module terminals 211 to 214, respectively.

Figure 6:
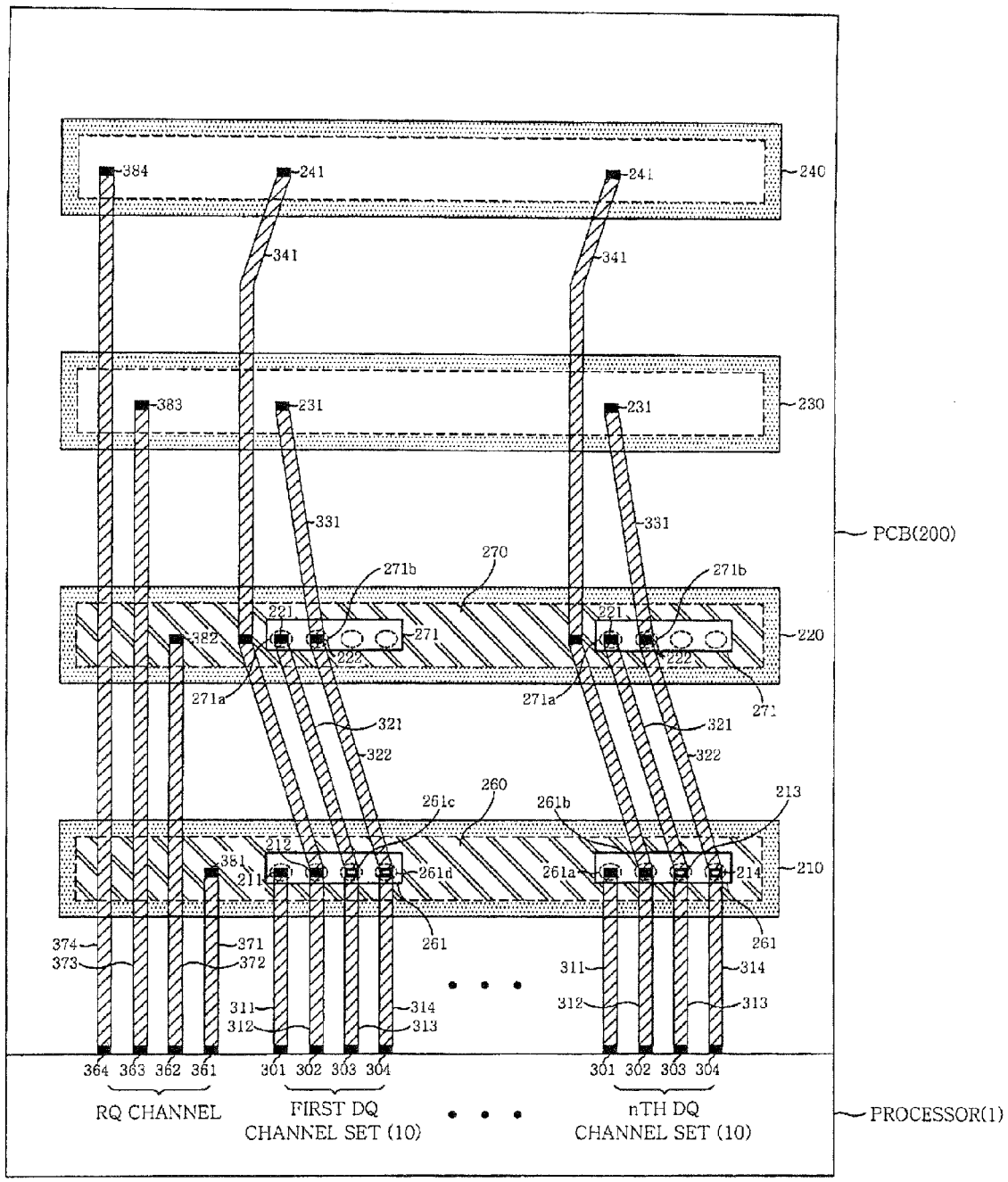
FIG. 6 is a diagram showing the case where memory modules are inserted into first and second slots in the PCB of FIG. 4.

FIG. 6 is a diagram showing the case where memory modules are inserted into first and second slots 210 and 220 in the PCB of FIG. 4. As shown in FIG. 6, data can also be transmitted to the module terminals 221 and 222 of the second slot 220. In this case, in memory devices 261 and 271 mounted in the memory modules 260 and 270, respectively, data is effectively input or output through DQ pads 261a and 271a, and 261b and 271b, connected to the first module terminals 211 and 221, and the second module terminals 212 and 222, respectively. In contrast, data is not effectively input or output through DQ pads 261c and 261d connected to the third and fourth module terminals 213 and 214 of the memory device 261 mounted in the memory module 260.

Figure 7:
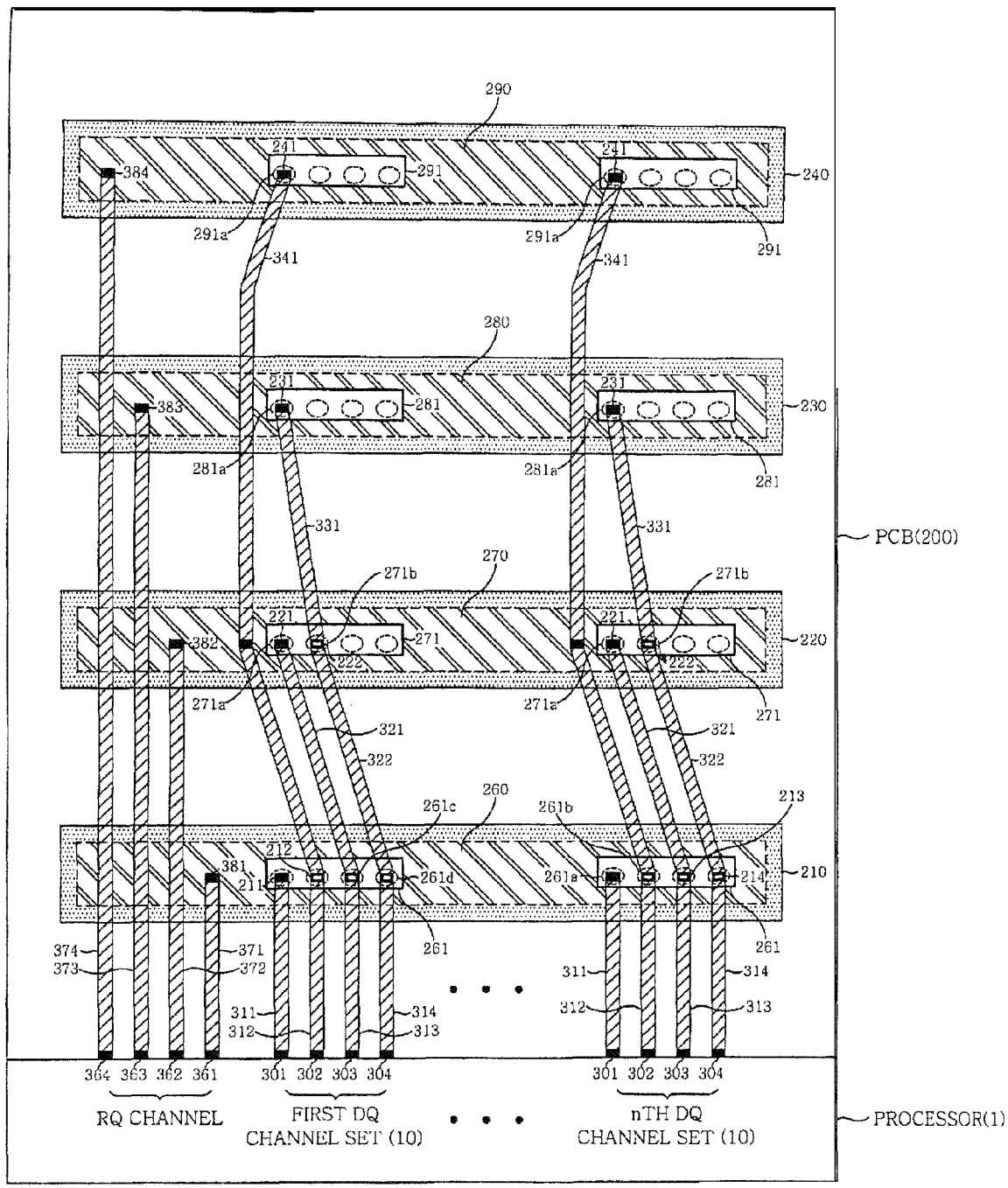
FIG. 7 is a diagram showing the case where memory modules are inserted into first to fourth slots in the PCB of FIG. 4.

FIG. 7 is a diagram showing the case where memory modules are inserted into first to fourth slots 210, 220, 230 and 230 in the PCB of FIG. 4. As shown in FIG. 7, data can also be transmitted to the module terminals 231 and 241 of third and fourth slots 230 and 240, respectively. In this case, in the memory devices 261, 271, 281 and 291 mounted in the memory modules 260, 270, 280 and 290, respectively, data is effectively input or output through DQ pads 261a, 271a, 281a and 291a connected to the first module terminals 211, 221, 231 and 241, respectively. In contrast, data is not effectively input or output through DQ pads 261b to 261d, connected to the second to fourth module terminals 212 to 214, respectively, in the memory device 261 mounted in the memory module 260, and through the DQ pad 271b, connected to the second module terminal 222, in the memory device 271 mounted in the memory module 270.

Figure 8:
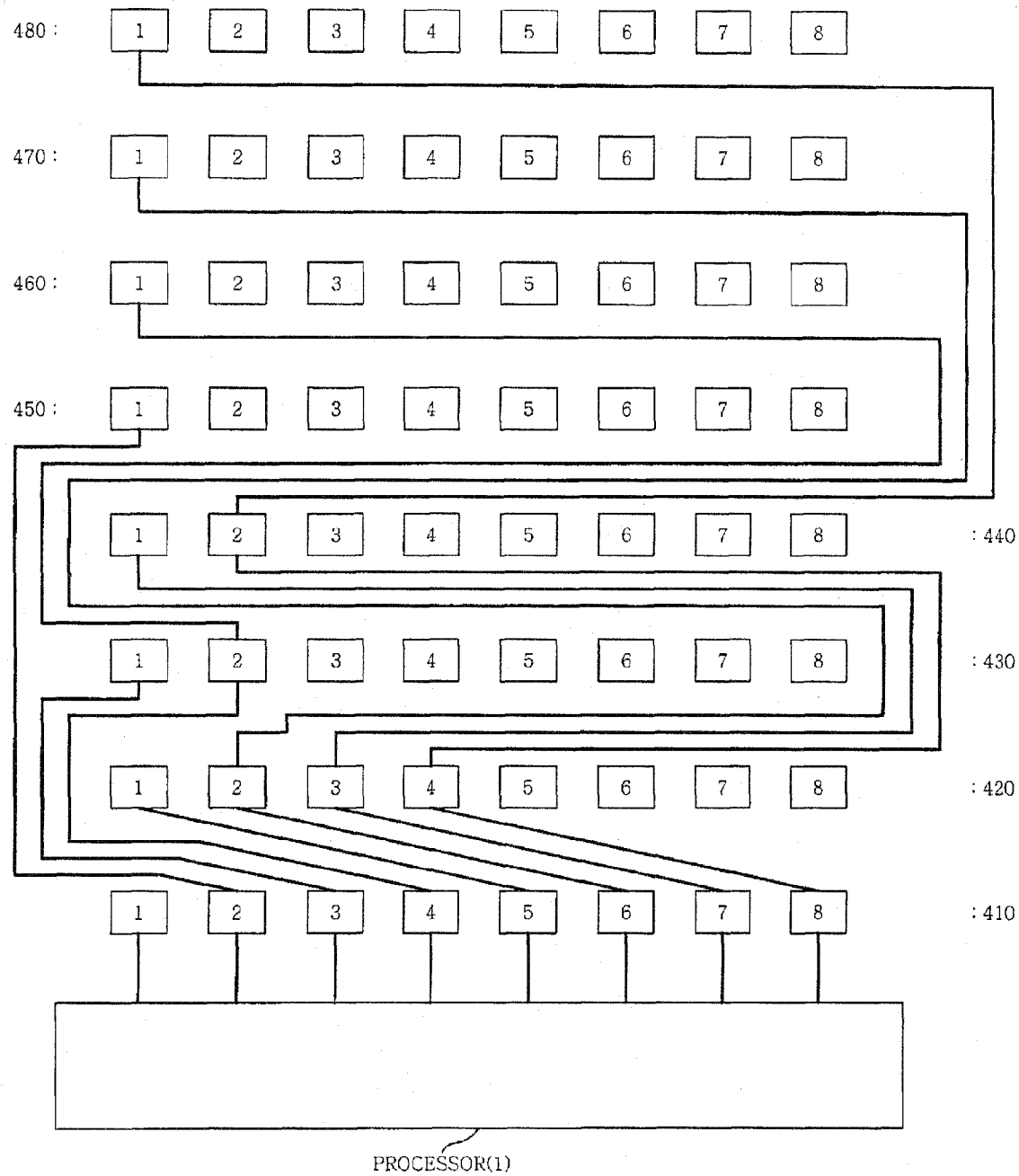
FIG. 8 is a diagram showing a PCB and a memory system including the PCB according to another embodiment of the present invention.

Meanwhile, the technical spirit of the present invention can be extended to a PCB having eight slots, as shown in the embodiment of FIG. 8. For reference, for convenience of understanding, only the connection of eight controller terminals 401 to 408, for transmitting or receiving data to or from a processor 1, to the module terminals of eight slots is simply shown.

In the embodiment of FIG. 8, when a memory module is inserted only into a first slot 410, data is effectively input or output through eight DQ pads connected to the first to eighth module terminals of the first slot 410.

Further, when memory modules are inserted into first and second slots 410 and 420, data is effectively input or output through four DQ pads connected to the first to fourth module terminals of each of the first and second slots 410 and 420.

Further, when memory modules are inserted into the first to fourth slots 410, 420, 430 and 440, data is effectively input or output through two DQ pads connected to the first and second module terminals of each of the first to fourth slots 410, 420, 430 and 440.

Further, when memory modules are inserted into first to eight slots 410, 420, 430, 440, 450, 460, 470 and 480, data is effectively input or output only through a single DQ pad connected to the first module terminal of each of the first to eight slots.

As described above, in the PCB and the memory system including the PCB according to the present invention, the insertion of a separate dummy module into a slot, into which an actually useful memory module is not inserted, is not required.

Further, in the PCB and memory system including the PCB according to the present invention, the number of slots into which memory modules can be inserted can be easily expanded to 2, 4, 8, etc. This shows that the expansibility of memory modules can be remarkably improved compared to a conventional PCB and memory system including the PCB, in which the number of slots, into which memory modules can be inserted, is limited to two.

In the above-described PCB and memory system including the PCB according to the present invention, dummy modules are not required upon expansion of the number of memory modules. Further, according to the PCB and memory system including the PCB of the present invention, the expansion of the number of memory modules is facilitated.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

For example, in the present specification, an embodiment in which the number of slots provided in a PCB is identical to the number of controller terminals corresponding to each DQ channel set is shown and described. However, even in an embodiment in which the number of slots is less than the number of controller terminals, the technical spirit of the present invention can be realized.

Therefore, the technical scope of the present invention should be defined by the technical spirit of the accompanying claims.

What is claimed is:

1. A printed circuit board, comprising:
a plurality of slots sequentially formed on a predetermined location on the printed circuit board, and connected to controller terminals through a plurality of wires, each slot being constructed so that a memory module in which at least one memory device capable of receiving $2^k$ pieces of data in parallel can be mounted can be inserted into the slot; and the controller terminals for transmitting or receiving data to or from a processor in parallel, the controller terminals being constructed so that $2^k$ controller terminals are arranged for a single memory device mounted in the memory module, wherein a slot disposed in a first location with respect to the controller terminals has $2^k$ module terminals, which are connected to the controller terminals in a point-to-point manner and are sequentially arranged, wherein each of slots disposed in locations ranging from a $(2^{n-1}+1)$th location (where n is a natural number equal to or less than k) to a $2^n$th location with respect to the controller terminals is connected in a point-to-point manner to module terminals of a corresponding one of slots ranging from the slot disposed in the first location to a slot disposed in a $2^{n-1}$th location in a point-to-point manner, and each of the slots includes $2^{k-n}$ module terminals, wherein the $2^{k-n}$ module terminals are sequentially arranged, and wherein each of the module terminals can provide data to a single memory device mounted in a memory module inserted into each slot, wherein module terminals of each of slots disposed in locations ranging from the $(2^{n-1}+1)$th location to the $2^n$th location are electrically connected to $(2^{k-n}+1)$th to $2^{k-n+1}$th module terminals of a corresponding slot.

2. The printed circuit board according to claim 1, wherein wires, which are required for connecting the module terminals of respective slots to each other, are non-intersected.

3. A memory system, comprising:

a processor for generating an instruction signal and data;

a printed circuit board including $2^k$ controller terminals (where k is a natural number), capable of transmitting or receiving data in parallel to or from the processor and capable of transmitting or receiving data to or from a single memory device, and a plurality of sequentially formed slots; and a plurality of memory modules inserted into the plurality of slots, each memory module having at least one memory device, wherein a slot disposed in a first location with respect to the controller terminals has $2^k$ module terminals, which are connected to the controller terminals in a point-to-point manner and are sequentially arranged, wherein each of slots disposed in locations ranging from a $(2^{n-1}+1)$th location (where n is a natural number equal to or less than k) to a $2^n$th location with respect to the controller terminals is connected in a point-to-point manner to module terminals of a corresponding one of slots ranging from the slot disposed in the first location to a slot disposed in a $2^{n-1}$th location in a point-to-point manner, and each of the slots includes $2^{k-n}$ module terminals, wherein the $2^{k-n}$ module terminals are sequentially arranged, and wherein each of the module terminals can provide data to a single memory device mounted in a memory module inserted into each slot, wherein module terminals of each of slots disposed in locations ranging from the $(2^{n-1}+1)$th location to the $2^n$th location are electrically connected to $(2^{k-n}+1)$th to $2^{k-n+1}$th module terminals of a corresponding slot.

4. The memory system according to claim 3, wherein wires, which are required for connecting the module terminals of respective slots to each other, are non-intersected.

* * * * *